US012648212B2

(12) United States Patent
Yoon

(10) Patent No.: US 12,648,212 B2
(45) Date of Patent: Jun. 2, 2026

(54) SEMICONDUCTOR DEVICE INCLUDING A TRANSISTOR HAVING A METAL-RICH METAL OXIDE LAYER

(71) Applicant: SK hynix Inc., Gyeonggi-do (KR)

(72) Inventor: Young Gwang Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 553 days.

(21) Appl. No.: 18/074,989

(22) Filed: Dec. 5, 2022

(65) Prior Publication Data

US 2024/0021696 A1     Jan. 18, 2024

(30) Foreign Application Priority Data

Jul. 13, 2022    (KR) ........................ 10-2022-0086095

(51) Int. Cl.
| | |
|---|---|
| *H10D 64/66* | (2025.01) |
| *H10D 30/62* | (2025.01) |
| *H10D 64/01* | (2025.01) |

(52) U.S. Cl.
CPC ....... *H10D 64/667* (2025.01); *H10D 30/6211* (2025.01); *H10D 64/01318* (2026.01)

(58) Field of Classification Search
CPC .............. H10D 64/667; H10D 30/6211; H01L 21/28088
See application file for complete search history.

(56) References Cited

U.S. PATENT DOCUMENTS

| | | | |
|---|---|---|---|
| 10,164,045 B2 | 12/2018 | Hou et al. | |
| 2010/0052071 A1* | 3/2010 | Niimi ................. | H10D 84/0177 |
| | | | 257/E21.632 |
| 2010/0123183 A1* | 5/2010 | Yamamoto .......... | H01L 21/0234 |
| | | | 257/E21.422 |
| 2010/0176454 A1* | 7/2010 | Hooker ................ | H10D 84/038 |
| | | | 257/369 |
| 2017/0194210 A1* | 7/2017 | Oh ..................... | H01L 21/02112 |
| 2019/0043979 A1* | 2/2019 | Liu ...................... | H10D 12/021 |
| 2019/0393355 A1* | 12/2019 | Yoo ........................ | G11C 11/223 |

FOREIGN PATENT DOCUMENTS

KR      10-2021-0035553 A      4/2021

* cited by examiner

*Primary Examiner* — Christine A Enad
(74) *Attorney, Agent, or Firm* — IP & T GROUP LLP

(57) ABSTRACT

A semiconductor device includes a gate dielectric layer over a substrate; a lower gate barrier layer over the gate dielectric layer; and a lower gate electrode over the lower gate barrier layer. The lower gate electrode includes at least one metal-rich metal oxide layer.

20 Claims, 20 Drawing Sheets

<u>100A</u>

<u>10</u>

100A

10

100B

10

100C

10

100D

10

10

10

10

10

10

10

10

10

10

10

10

10

10

38a
22a
33c
33b
32c
32b
31c
31b
21a
15a

30b

10

10

10

10

SEMICONDUCTOR DEVICE INCLUDING A TRANSISTOR HAVING A METAL-RICH METAL OXIDE LAYER

CROSS-REFERENCE TO RELATED APPLICATIONS

The present application claims priority of Korean Patent Application No. 10-2022-0086095, filed on Jul. 13, 2022, which is incorporated herein by reference in its entirety.

BACKGROUND

1. Field

The present disclosure relates to a semiconductor device including a transistor having a metal-rich metal oxide layer and methods of manufacturing the semiconductor device.

2. Description of the Related Art

Consumer demand for smaller, and more powerful electronic devices requires continuous improvements in the semiconductor devices employed in the electronic device. One important consideration is power consumption which is at least partially dependent upon the threshold voltage of the transistors of the semiconductor devices. Hence, developing a transistor of a semiconductor device with low threshold voltage would be highly desirable.

SUMMARY

The present invention disclosure provides a semiconductor device including a transistor having a low threshold voltage.

An embodiment of the present invention disclosure provides a semiconductor device including a transistor having a metal-rich metal oxide layer.

An embodiment of the present disclosure provides a method of manufacturing a semiconductor device including a transistor having a low threshold voltage.

An embodiment of the present disclosure provides a method of manufacturing a semiconductor device including a transistor having a metal-rich metal oxide layer.

A semiconductor device in accordance with an embodiment of the present disclosure includes a gate dielectric layer over a substrate; a lower gate barrier layer over the gate dielectric layer; and a lower gate electrode over the lower gate barrier layer. The lower gate electrode includes at least one metal-rich metal oxide layer.

A semiconductor device in accordance with an embodiment of the present disclosure includes an interface insulating layer formed over a substrate; a gate dielectric layer formed over the interface insulating layer; a lower gate barrier layer formed over the gate dielectric layer; a lower gate electrode formed over the lower gate barrier layer; an upper gate barrier layer formed over the lower gate electrode; and an upper gate electrode formed over the upper gate barrier layer. The lower gate electrode includes a plurality of metal-rich metal oxide layers.

A semiconductor device in accordance with an embodiment of the present disclosure includes a fin region protruding from a substrate; a field insulating layer formed over the substrate and surrounding a lower portion of the fin region; an interface insulating layer formed over a surface of the fin region; a gate dielectric layer formed over an upper surface of the field insulating layer and an upper surface of the interface insulating layer; a lower gate barrier layer formed over the gate dielectric layer; and a lower gate electrode formed over the lower gate barrier layer. The lower gate electrode includes a metal-rich metal oxide layer.

A method of manufacturing a semiconductor device in accordance with an embodiment of the present disclosure includes forming a gate dielectric layer over a substrate; forming a lower gate barrier layer over the gate dielectric layer; and forming a lower gate electrode over the lower gate barrier layer. The forming the lower gate electrode includes forming a first metal oxide layer over the lower gate barrier layer; and forming the first metal oxide layer into a first metal-rich metal oxide layer. The first metal-rich metal oxide layer includes oxygen vacancy greater than that of the first metal oxide layer.

A method of manufacturing a semiconductor device in accordance with an embodiment of the present disclosure includes forming a dummy gate electrode over a substrate; forming spacers over both sides of the dummy gate electrode; forming a groove between the spacers by removing the dummy gate electrode; forming an interface insulating layer over a surface of the substrate exposed in the groove; forming a gate dielectric layer over the interface insulating layer in the groove; forming a lower gate barrier layer over the gate dielectric layer; and forming a lower gate electrode over the lower gate barrier layer. The forming the lower gate electrode includes forming a first metal oxide layer over the lower gate barrier layer; and forming the first metal oxide into a first metal-rich metal oxide layer.

A method of manufacturing a semiconductor device in accordance with an embodiment of the present disclosure includes forming a fin region protruding from a substrate; forming a gate dielectric layer over a surface of the fin region; forming a lower gate barrier layer over the gate dielectric layer; and forming a lower gate electrode over the lower gate barrier layer. The forming the lower gate electrode includes forming a first metal oxide layer, and forming the first metal oxide layer into a first metal-rich metal oxide layer.

A method of manufacturing a semiconductor device in accordance with an embodiment of the present disclosure includes forming a gate dielectric layer over a substrate; forming a lower gate barrier layer over the gate dielectric layer; and forming a lower gate electrode over the lower gate barrier layer. The forming the lower gate electrode includes forming at least one metal-rich metal oxide layer.

DETAILED DESCRIPTION

Figure 1A:
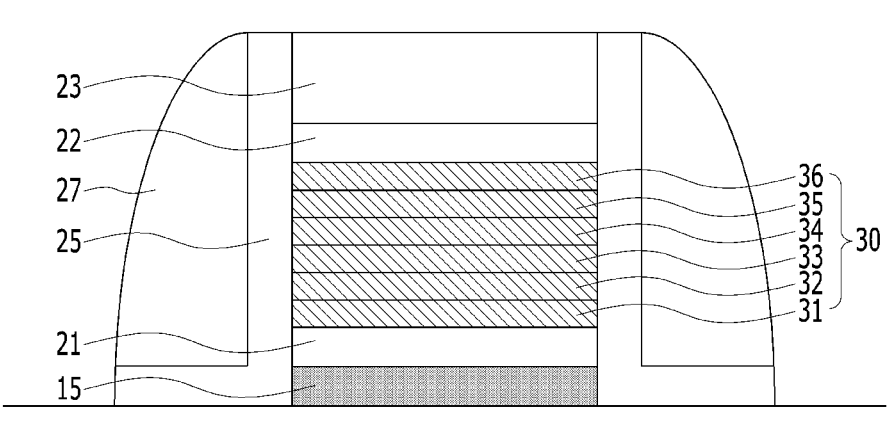
FIGS. 1A to 3C are simplified diagrams illustrating PMOS transistors of semiconductor devices according to embodiments of the present disclosure.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

Other expressions that explain the relationship between elements, such as "between", "directly between", "adjacent to" or "directly adjacent to" should be construed in the same way.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly over the second layer or the substrate but also a case where a third layer exists between the first layer and the second layer or the substrate.

FIGS. 1A to 3C are simplified diagrams illustrating PMOS transistors 100A to 100D, 200A to 200B, and 300A to 300B of semiconductor devices according to embodiments of the present disclosure.

Referring to FIG. 1A, a PMOS transistor 100A of a semiconductor device according to an embodiment of the present disclosure may include a stack including a gate dielectric layer 15, a lower gate barrier layer 21, a lower gate electrode 30, an upper gate barrier layer 22, and a capping insulating layer 23 stacked over or directly on a substrate 10. The PMOS transistor 100A may further include a buffer insulating layer 25 formed over or directly on the sides of the stack and a top surface of the substrate 10 and a spacer 27 formed over the buffer insulating layer 25.

The substrate 10 may include, for example, a single crystalline silicon wafer, an epitaxially grown single crystalline silicon layer, a silicon-on-insulator (SOI), or a SiGe layer. The substrate 10 may also include n-type ions such as phosphorous (P) or arsenic (As).

The gate dielectric layer 15 may include, for example, a high-k insulating material such as hafnium oxide, hafnium silicon oxide, zirconium oxide, zirconium silicon oxide, hafnium zirconium oxide, or hafnium zirconium silicon oxide. In an embodiment, the gate dielectric layer 15 may include multi-layered insulating layers.

The lower gate barrier layer 21 may include, for example, at least one of Ti, Ti/TiN, TiN, Ta, Ta/TaN, TaN, or various other conductive barrier layers.

The lower gate electrode 30 may include multi-layered metal-rich metal oxide layers 31 to 36. The metal-rich metal oxide layers 31 to 36 may have an oxygen mass ratio lower than an oxygen mass ratio based on the Law of Definite Proportions and have a high oxygen vacancy concentration. For example, the oxygen vacancy may occur because some of oxygen bonds in the metal-rich metal oxide layers 31 to 36 are broken. Accordingly, the metal-rich metal oxide layers 31 to 36 may have a higher metal mass ratio and a lower oxygen mass ratio than the metal mass ratio and the oxygen mass ratio in a metal oxide based on the Law of Definite Proportions. The metal-rich metal oxide layers 31 to 36 have a higher work function than a metal layer. Accordingly, a threshold voltage of the PMOS transistor 100A may be lowered, and the PMOS transistor 100A may a have low power consumption and a high operating speed. For example, the metal-rich metal oxide layers 31 to 36 may include molybdenum oxide (MoO). The molybdenum (Mo) has a higher work function than the work functions of titanium (Ti), aluminum (Al), and tungsten (W). The molybdenum oxide (MoO) may have a smaller thickness and a higher work function than those of titanium compounds, aluminum compounds, and tungsten compounds. In conclusion, the PMOS transistor 100A according to the embodiment of the disclosure can have a lower threshold voltage and a lower power consumption than those of a conventional PMOS transistor including titanium (Ti), aluminum (Al), and tungsten (W) as a gate electrode, and can be more highly integrated than the conventional PMOS transistor. In an embodiment, the metal-rich metal oxide layers 31 to 36 may be integrated as a whole to form one lower gate electrode 30. For example, interfaces of the metal-rich metal oxide layers 31 to 36 may exist virtually. In an embodiment, a molybdenum (Mo) concentration gradient or an oxygen concentration gradient may be formed in the metal-rich metal oxide layers 31 to 36. For example, the lowermost metal-rich metal oxide layer 31 has the highest molybdenum (Mo) concentration (or the lowest oxygen concentration), and the uppermost metal-rich metal oxide layer 36 has the lowest molybdenum (Mo) concentration (or the highest oxygen concentration). In another embodiment, the lowermost metal-rich metal oxide layer 31 has the lowest molybdenum (Mo) concentration (or the highest oxygen concentration) and the uppermost metal-rich metal oxide layer 36 has the highest molybdenum (Mo) concentration (or lowest oxygen concentration).

The upper gate barrier layer 22 may include, for example, at least one of Ti, Ti/TiN, TiN, Ta, Ta/TaN, TaN, WN, or various other conductive barrier layers.

The capping insulating layer 23 may include an insulating material having an etch selectivity with respect to silicon oxide ($SiO_2$), such as, for example, silicon nitride (SiN) or silicon oxynitride (SiON).

The buffer insulating layer 25 may include an insulating material having an etch selectivity with respect to the capping insulating layer 23, such as silicon oxide ($SiO_2$).

The spacer 27 may include an insulating material having an etch selectivity with respect to the buffer insulating layer 25, such as, for example, silicon nitride (SiN).

Figure 1B:
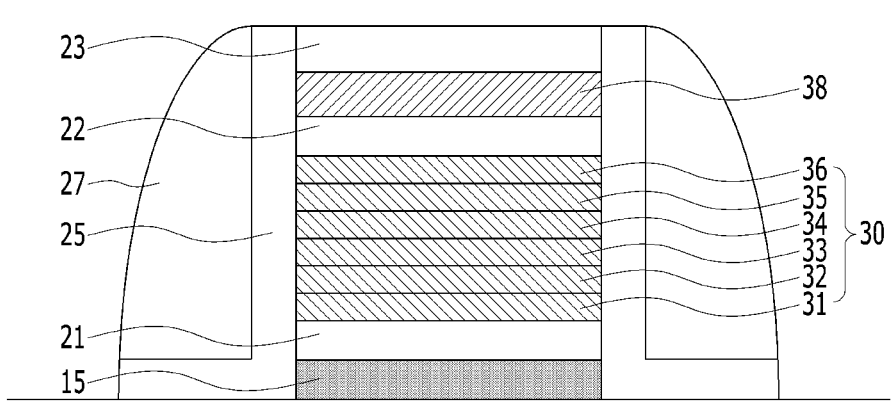

Referring to FIG. 1B, a PMOS transistor 100B of a semiconductor device according to an embodiment of the present disclosure may further include an upper gate electrode 38 as compared to the PMOS transistor 100A of FIG. 1A. The upper gate electrode 38 may have higher conductivity than the lower gate barrier layer 21, the lower gate electrode 30, and the upper gate barrier layer 22. For example, the upper gate electrode 38 may include a metal such as, for example, tungsten (W).

Figure 1C:
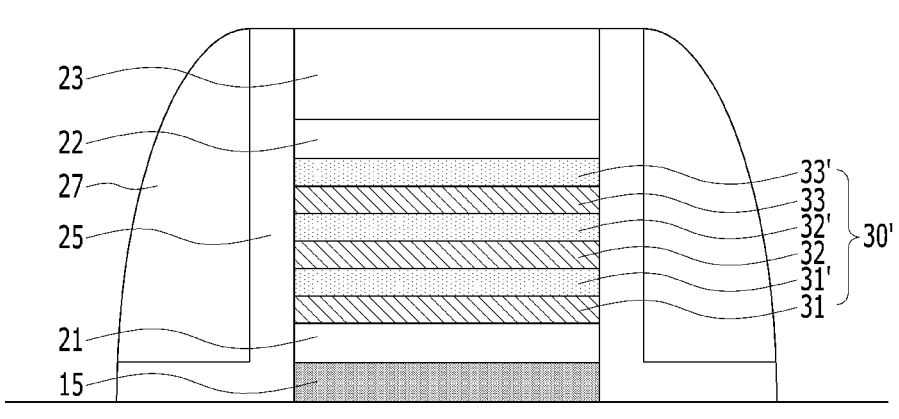

Referring to FIG. 1C, a PMOS transistor 100C of a semiconductor device according to an embodiment of the present disclosure may include a gate dielectric layer 15, a lower gate barrier layer 21, a lower gate electrode 30', an upper gate barrier layer 22, and a capping insulating layer 23 a substrate 10. The PMOS transistor 100C may further include a buffer insulating layer 25 and a spacer 27. Compared with the lower gate electrode 30 of the PMOS transistor 100A of FIG. 1A, the lower gate electrode 30' may include metal-rich metal oxide layers 31, 32, and 33 and metal layers 31', 32', and 33' alternately stacked. The metal layers 31', 32', and 33' may compensate for the low conductivity of the metal-rich metal oxide layers 31, 32, and 33. The metal layers 31', 32', and 33' and the metal-rich metal oxide layers 31, 32, and 33 may include the same metal. For example, the metal layers 31', 32', and 33' may include molybdenum (Mo), and the metal-rich metal oxide layers 31, 32, and 33 may include molybdenum oxide (MoO).

Figure 1D:
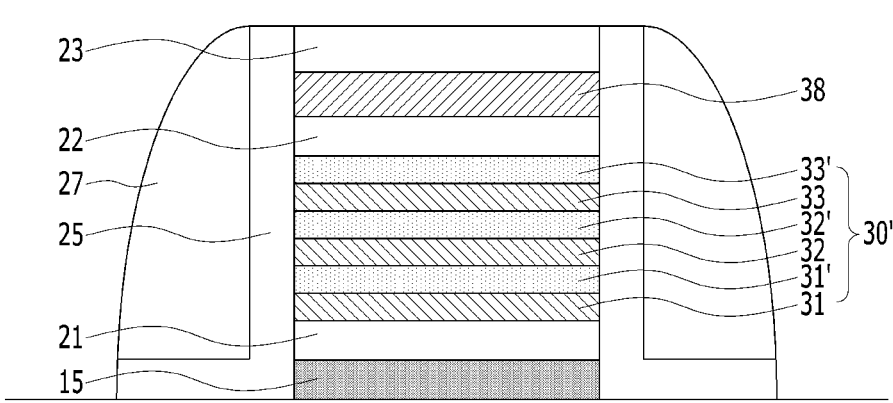

Referring to FIG. 1D, a PMOS transistor 100D of a semiconductor device according to an embodiment of the present disclosure may further include an upper gate electrode 38 compared to the PMOS transistor 100C of the semiconductor device of FIG. 10. The upper gate electrode 38 may have higher conductivity than the lower gate barrier layer 21, the lower gate electrode 30', and the upper gate barrier layer 22. For example, the upper gate electrode 38 may include a metal such as, for example, tungsten (W).

Figure 2A:
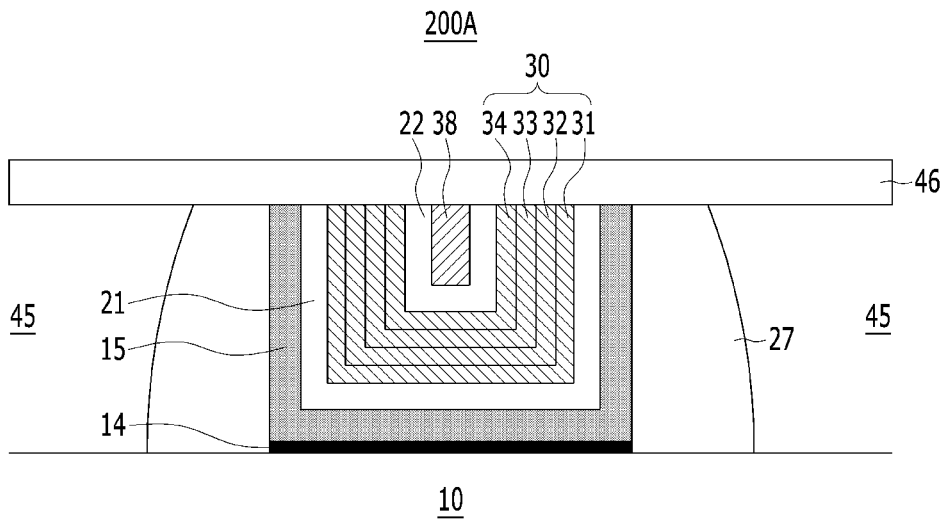

Referring to FIG. 2A, a PMOS transistor 200A of a semiconductor device according to an embodiment of the present disclosure may include an interface insulating layer 14, a gate dielectric layer 15, a lower gate barrier layer 21, a lower gate electrode 30, an upper gate barrier layer 22, and an upper gate electrode 38 stacked over or directly on a substrate 10. The PMOS transistor 200A may further include a spacer 27, a lower interlayer insulating layer 45, and an upper interlayer insulating layer 46.

The interface insulating layer 14 may include, for example, silicon oxide (SiO$_2$) and may be directly formed on a top surface of the substrate 10.

The gate dielectric layer 15, the lower gate barrier layer 21, the lower gate electrode 30, and the upper gate barrier layer 22 may have U-shaped longitudinal cross-sections. For example, the upper barrier layer 22 may surround side surfaces and a bottom surface of the upper gate electrode 38. The lower gate electrode 30 may surround side surfaces and a bottom surface of the upper gate electrode 38. The lower gate barrier layer 21 may surround side surfaces and a bottom surface of the lower gate electrode 30. The gate dielectric layer 15 may surround side surfaces and a bottom surface of the lower gate barrier layer 21.

The lower interlayer insulating layer 45 may include, for example, silicon oxide (SiO$_2$), and the spacers 27 and the upper interlayer insulating layer 46 may include an insulating material having an etch selectivity with respect to the lower interlayer insulating layer 45 (e.g., silicon nitride (SiN)).

The lower gate electrode 30 may include a single layered or multi-layered metal-rich oxide layers 31 to 34.

Figure 2B:
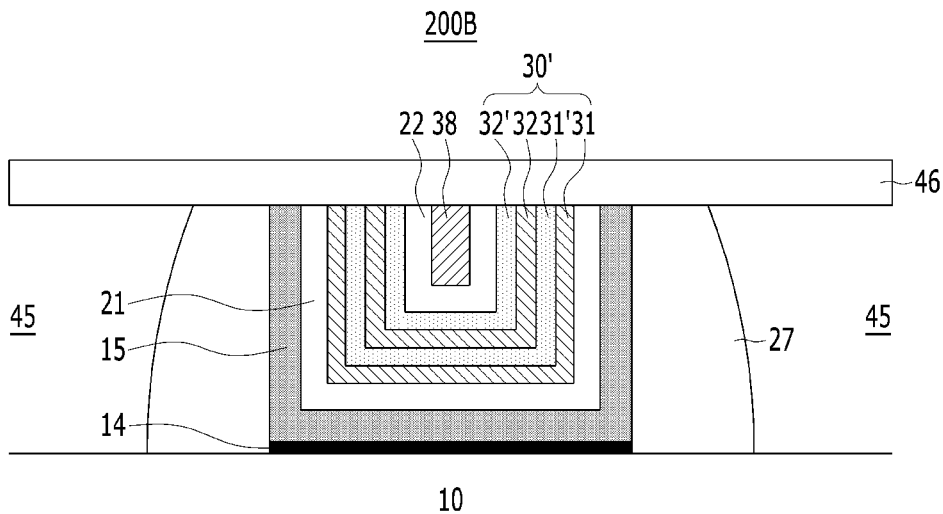

Referring to FIG. 2B, a PMOS transistor 200B of the semiconductor device according to an embodiment of the present disclosure may include a lower gate electrode 30' compared to the PMOS transistor 200A of FIG. 2A. For example, the lower gate electrode 30 of FIG. 2A including only the metal-rich oxide layers 31 to 34 may be replaced to the lower gate electrode 30' including the metal-rich oxide layers 31 and 32 and the metal layers 31' and 32' alternately stacked.

Figure 3A:
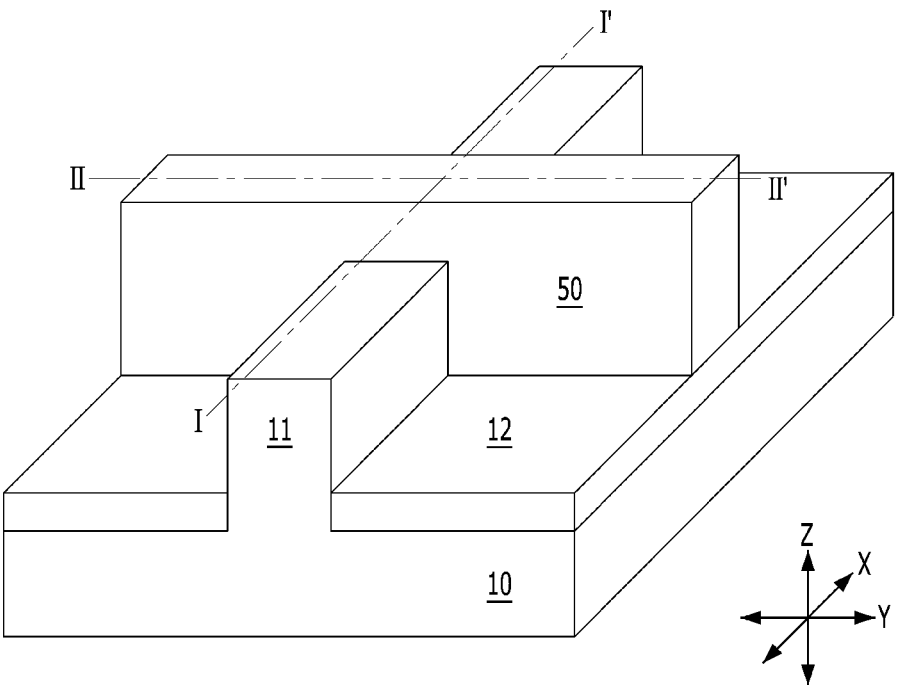
Figure 3B:
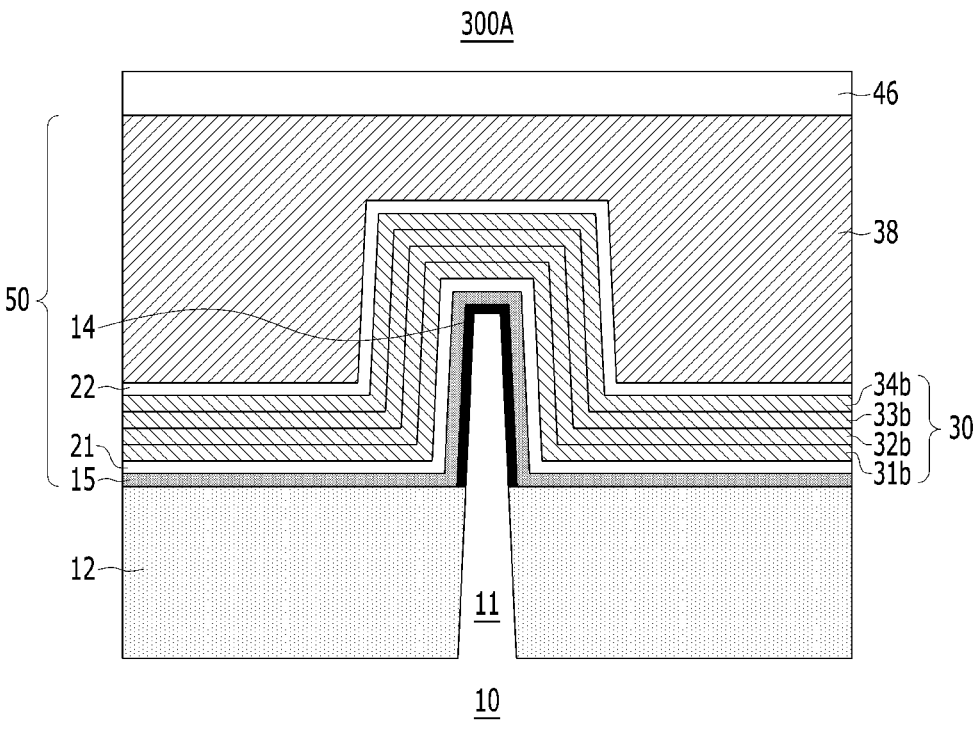
Figure 3C:
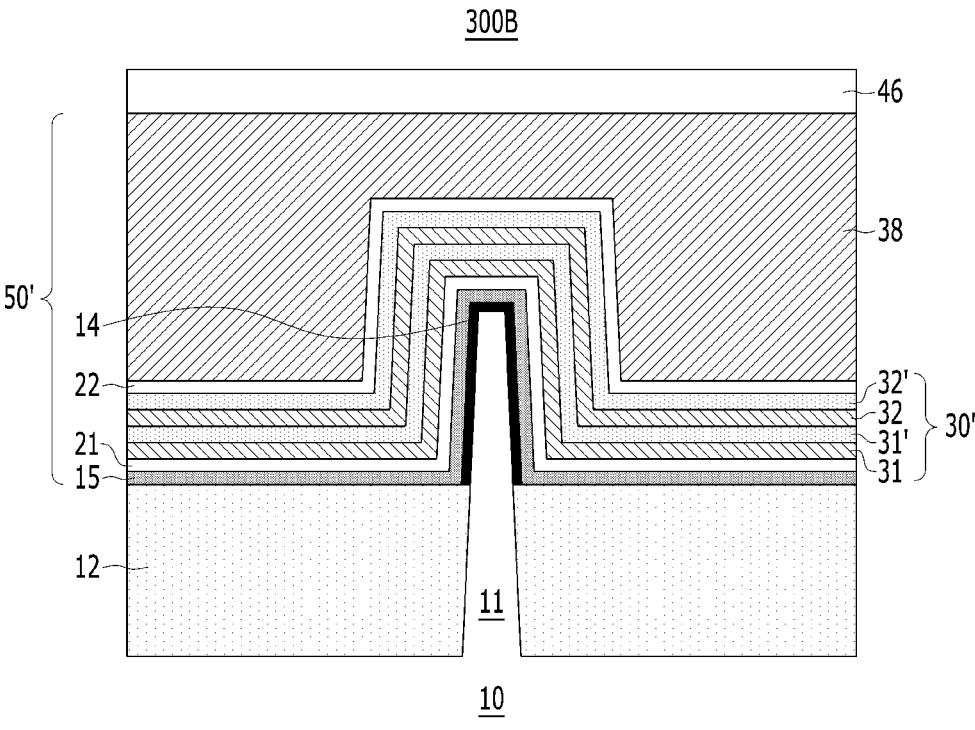

FIGS. 3A to 3B are simplified diagrams illustrating PMOS transistors 300A and 300B of semiconductor devices according to embodiments of the present disclosure. FIG. 3A is a perspective view, and FIGS. 3B and 3C are longitudinal cross-sectional views taken along a line II-II' of FIG. 3A.

Referring to FIGS. 3A and 3B, a PMOS transistor 300A of a semiconductor device according to an embodiment of the present disclosure may include a fin region 11 protruding from a substrate 10, a field insulating layer 12, a gate electrode structure 50, and an upper interlayer insulating layer 46 on the substrate 10. The PMOS transistor 200A of the semiconductor device of FIG. 2A may be understood as a longitudinal cross-sectional view taken along the line I-I' of FIG. 3A. In this case, the substrate 10 of FIG. 2A may be regarded as the fin region 11 of FIGS. 3A and 3B.

The field insulating layer 12 may be formed over or directly on the substrate 10 to surround a lower portion of the fin region 11.

The gate electrode structure 50 may include an interface insulating layer 14, a gate dielectric layer 15, a lower gate barrier layer 21, a lower gate electrode 30, an upper gate barrier layer 22, and an upper gate electrode 38.

The interface insulating layer 14 may be conformally formed on an exposed surface of the fin region 11.

The gate dielectric layer 15 may be conformally formed on a surface of the field insulating layer 12 and an upper surface of the interface insulating layer 14.

The lower gate barrier layer 21 may be conformally formed on an upper surface of the gate dielectric layer 15.

The lower gate electrode 30 may be conformally formed on an upper surface of the lower gate barrier layer 21. The lower gate electrode 30 may include multi-layered metal-rich metal oxide layers 31b to 34b. For example, the metal-rich metal oxide layers 31b to 34b may include molybdenum oxide (MoO).

Referring to FIGS. 3A and 3C, a PMOS transistor 300B of a semiconductor device according to an embodiment of the present disclosure may include a fin region 11 protruding from a substrate 10, and a stack including a field insulating layer 12, a gate electrode structure 50', and an upper interlayer insulating layer 46 formed over or on the substrate 10. The PMOS transistor 200B of the semiconductor device of FIG. 2B may be understood as a longitudinal cross-sectional view taken along the line I-I' of FIG. 3A. In this case, the substrate 10 of FIG. 2B may be regarded as the fin region 11 of FIGS. 3A and 3C.

The gate electrode structure 50' may include an interface insulating layer 14, a gate dielectric layer 15, a lower gate barrier layer 21, a lower gate electrode 30', an upper gate barrier layer 22, and an upper gate electrode 38.

The lower gate electrode 30' may be conformally formed on an upper surface of the lower gate barrier layer 21. The lower gate electrode 30' may include multi-layered metal-rich metal oxide layers 31 and 32 and metal layers 31' and 32' alternately stacked. For example, the metal-rich metal oxide layers 31 to 34 may include molybdenum oxide (MoO), and the metal layers 31' and 32' may include molybdenum (Mo).

Figure 4A:
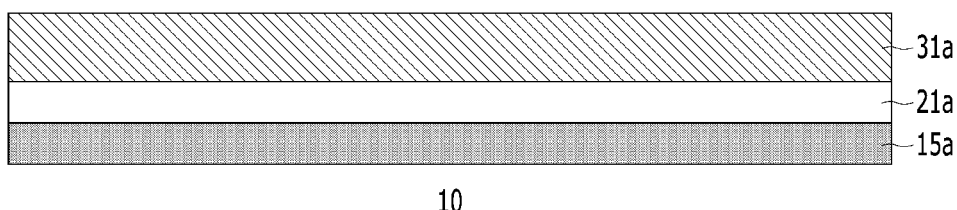
FIGS. 4A to 4H are longitudinal cross-sectional views illustrating a method of forming a transistor of a semiconductor device according to an embodiment of the present disclosure.

FIGS. 4A to 4H are longitudinal cross-sectional views illustrating a method of forming a transistor of a semiconductor device according to an embodiment of the present disclosure. Referring to FIG. 4A, a method of forming a transistor of a semiconductor device according to an embodiment of the present disclosure may include forming a gate dielectric material layer 15a on a substrate 10, forming a lower gate barrier material layer 21a on the gate dielectric layer 15a, and forming a first metal oxide layer 31a on the lower gate barrier material layer 21a by performing sequentially a series of deposition processes. For example, the first metal oxide layer 31a may include molybdenum oxide (MoO).

Figure 4B:
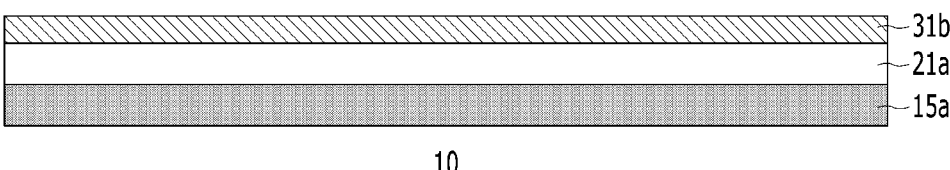

Referring to FIG. 4B, the method may further include performing a fluorine-treatment process for treating the first metal oxide layer 31a to form a first metal-rich oxide layer 31b. The fluorine treatment process for treating the first metal oxide layer 31a may include performing an etch process using, for example, sulfur hexafluoride ($SF_6$). As described above, the first metal-rich metal oxide layer 31b may have a higher metal mass ratio (i.e., a lower oxygen concentration) than the first metal oxide layer 31a. That is, the first metal-rich metal oxide layer 31b may have a higher oxygen vacancy concentration and a higher metal mass ratio than the first metal oxide layer 31a. If the first metal oxide layer 31a is too thick, the first metal-rich metal oxide layer 31b may not be sufficiently fluorinated. That is, the first metal-rich metal oxide layer 31b may not have a sufficiently high oxygen concentration.

Figure 4C:
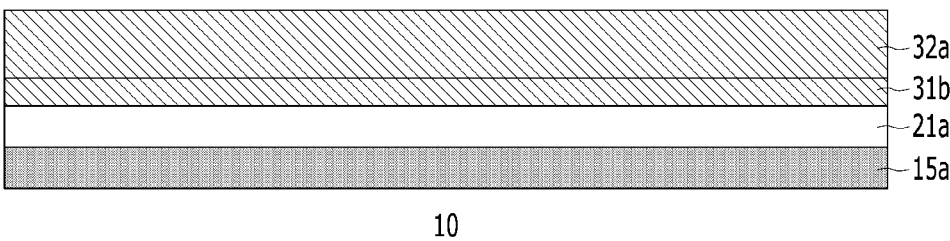

Referring to FIG. 4C, the method may further include performing a deposition process to form a second metal oxide layer 32a on the first metal-rich metal oxide layer 31b.

Figure 4D:
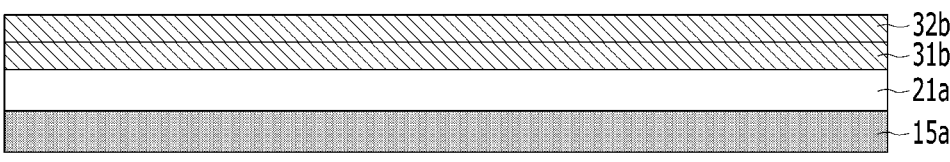

Referring to FIG. 4D, the method may further include performing the fluorine-treatment process for treating the second metal oxide layer 32a to form a second metal-rich oxide layer 32b.

Figure 4E:
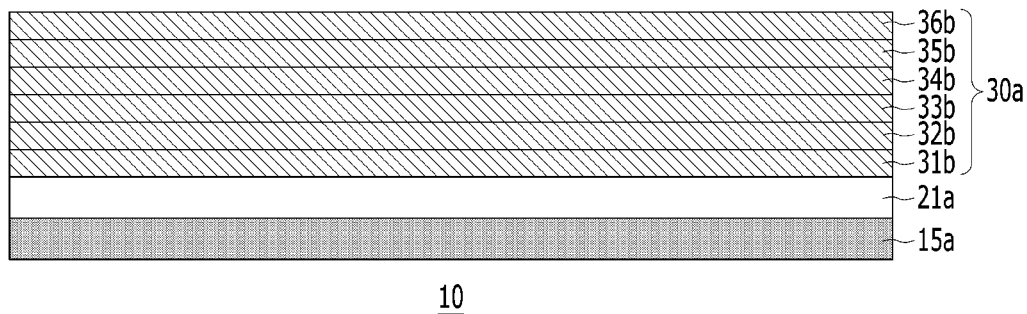

Referring to FIG. 4E, the method may further include repeatedly performing the deposition processes and the fluorine-treatment process described with reference to FIGS. 4C and 4D to form a metal-rich metal oxide layer stack 30a. The metal-rich metal oxide layer stack 30a may include a plurality of metal-rich metal oxide layers 31b to 36b. For example, the plurality of metal-rich metal oxide layers 31b to 36b may be formed by performing deposition processes to form metal oxide layers and performing the fluorine-treatment processes to treat the metal oxide layers, respectively. The metal-rich metal oxide layer stack 30a (see FIG. 4E) may include, for example, at least one metal-rich metal oxide layer. The metal-rich metal oxide layer stack 30a having a thick thickness may be formed by stacking multi-layered thin metal-rich metal oxide layers 31b to 36b. A metal concentration gradient or an oxygen concentration gradient may be formed in the multi-layered metal-rich metal oxide layers 31b to 36b of the metal-rich metal oxide layer stack 30a. For example, the lowermost metal-rich metal oxide layer 31b may have the highest metal concentration (or lowest oxygen concentration) than the other layers because the lowermost metal-rich metal oxide layer 31b may be exposed to the fluorine treatment processes multiple times. The uppermost metal-rich metal oxide layer 36b may have the lowest metal concentration (or highest oxygen concentration) than the other layers because the uppermost metal-rich metal oxide layer 36b may be exposed to a fluorine treatment process at one time. In an embodiment, when the fluorine treatment processes are not performed identically, the metal concentration gradient or the oxygen concentration gradient in the metal-rich metal oxide layers 31b to 36b may be variously adjusted.

Figure 4F:
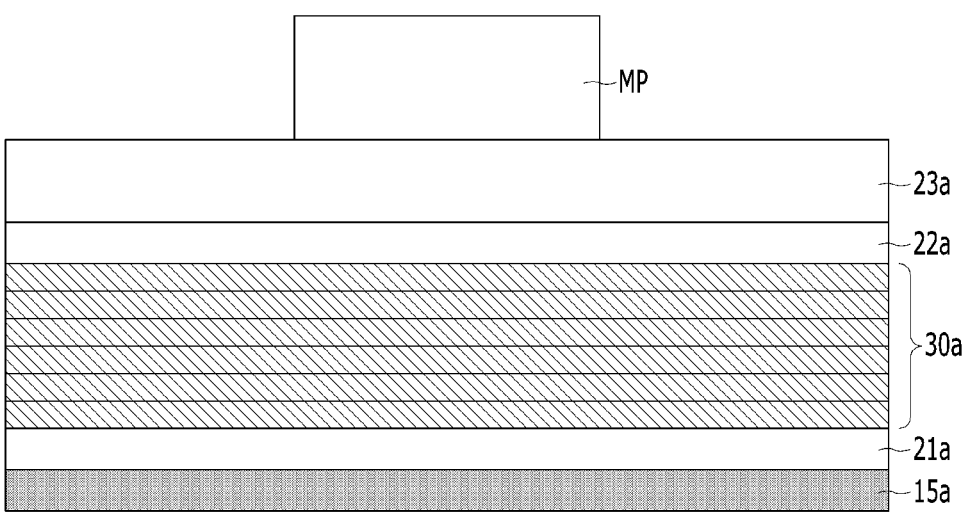

Referring to FIG. 4F, the method may further include forming an upper gate barrier material layer 22a and a capping insulating material layer 23a on the metal-rich metal oxide layer stack 30a, and forming a mask pattern MP on the capping insulating material layer 23a. Forming the upper gate barrier material layer 22a may include forming a conductive barrier layer including at least one of Ti, TiN, Ta, TaN, or various other conductive barrier materials by performing a deposition process. Forming the capping material layer 23a may include performing a deposition process to form silicon nitride (SiN) layer.

Figure 4G:
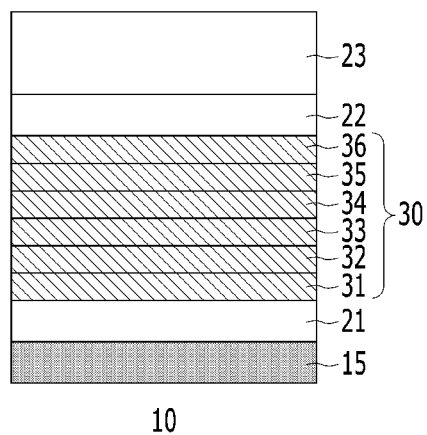

Referring to FIG. 4G, the method may further include forming a gate dielectric layer 15, a lower gate barrier layer 21, a lower gate electrode 30, an upper gate barrier layer 22, and a capping insulating layer 23 by performing a patterning process. The patterning process may include performing an etch process using the mask pattern MP as an etch mask to selectively etch the capping insulating material layer 23a, the upper gate barrier material layer 22a, the metal-rich metal oxide layer stack 30a, the lower gate barrier material layer 21a, and the gate dielectric material layer 15a. The method may further include removing the mask pattern MP. The lower gate electrode 30 may include first to sixth metal-rich metal oxide layers 31 to 36.

Figure 4H:
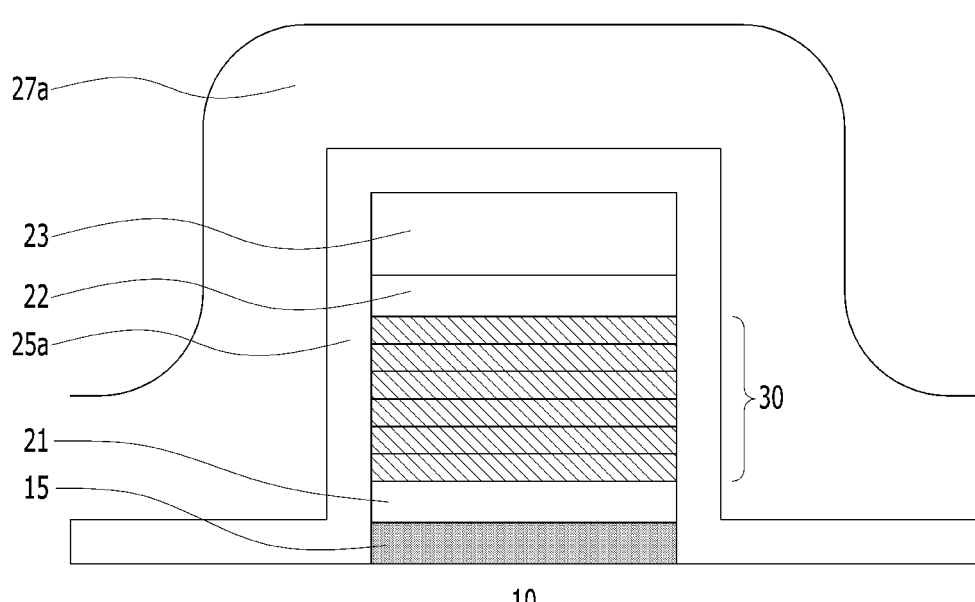

Referring to FIG. 4H, the method may further include conformally forming a buffer oxide layer 25a and a spacer material layer 27a. The buffer oxide layer 25a may be conformally formed on an upper surface of the substrate 10, side surfaces of the gate dielectric layer 15, the lower gate barrier layer 21, the lower gate electrode 30, and the upper gate barrier layer 22, and an upper surface and side surfaces of the capping insulating layer 23. The spacer material layer 27a may be conformally formed on an upper surface of the buffer oxide layer 25a. The buffer oxide layer 25a may include, for example, silicon oxide ($SiO_2$). The spacer material layer 27a may include, for example, silicon nitride (SiN).

Thereafter, referring to FIG. 1A, the method may further include performing an etch-back process to blanket etch the spacer material layer 27a to form spacers 27. A portion of the buffer oxide layer 25a on the capping insulating layer 23 may be removed to form a buffer layer 25. The buffer layer 25 may remain or be formed over or directly on the upper surface of the substrate 10, the side surfaces of the gate dielectric layer 15, the lower gate barrier layer 21, the lower gate electrode 30, and the capping insulating layer 23. An upper surface of the capping insulating layer 23 may be exposed.

Figure 5A:
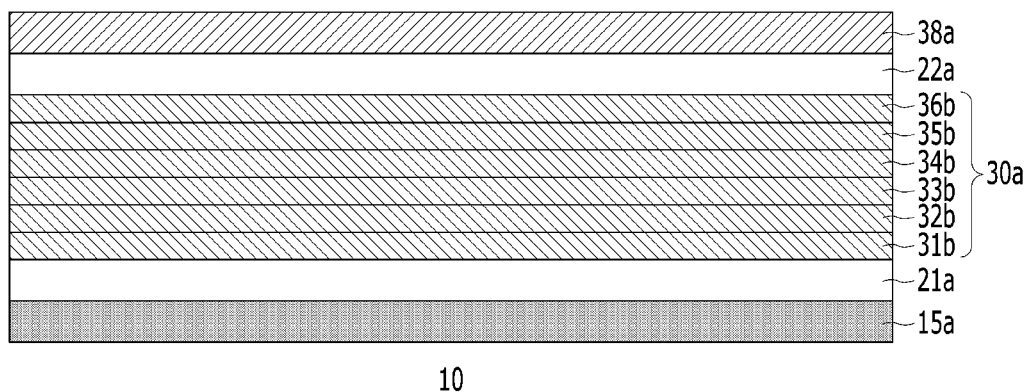
FIGS. 5A and 5B are longitudinal cross-sectional views illustrating a method of forming a transistor of a semiconductor device according to an embodiment of the present disclosure.
Figure 5B:
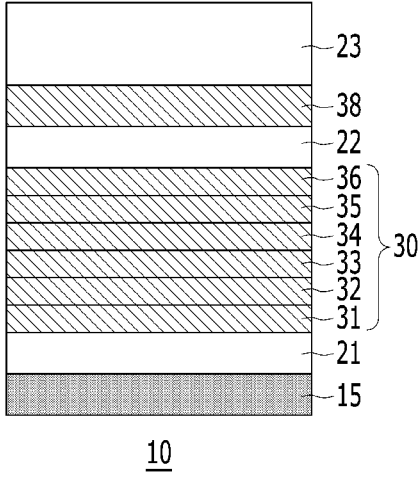

FIGS. 5A and 5B are longitudinal cross-sectional views illustrating a method of forming a transistor of a semiconductor device according to an embodiment of the present disclosure. Referring to FIG. 5A, a method of forming a transistor of a semiconductor device according to an embodiment of the present disclosure may include performing the processes described with reference to FIGS. 4A to 4E to form the metal-rich metal oxide layer stack 30a, and forming an upper gate barrier material layer 22a and a gate electrode metal layer 38a on the uppermost metal-rich metal oxide layer 36b of the metal-rich metal oxide layer stack 30a. The metal-rich metal oxide layer stack 30a may include multi-layered metal-rich metal oxide layers 31*b* to 36*b* and the upper gate barrier material layer 22*a*, and the gate electrode metal layer 38*a*. Forming the gate electrode metal layer 38*a* may include performing a deposition process or a plating process to form a metal layer including at least one of tungsten (W), copper (Cu), or other metallic materials.

Referring to FIG. 5B, the method may further include performing the processes described with reference to FIGS. 4F and 4G to form a gate dielectric layer 15, a lower gate barrier layer 21, a lower gate electrode 30, an upper gate barrier layer 22, an upper gate electrode 38, and a capping insulating layer 23. The lower gate electrode 30 may include first to sixth metal-rich metal oxide layers 31 to 36. There-after, the method may further include performing the pro-cesses described with reference to FIG. 4H to form a buffer oxide layer 25*a* and a spacer material layer 27*a*, and with reference to FIG. 1B, etching-back the spacer material layer 27*a* and the buffer oxide layer 25*a* to form a spacers 27 and a buffer layer 25.

Figure 6A:
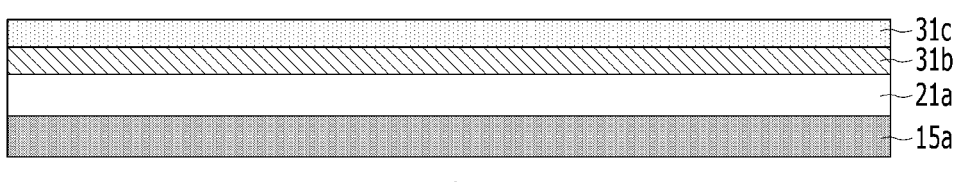
FIGS. 6A to 6C are longitudinal cross-sectional views illustrating a method of forming a transistor of a semiconductor device according to an embodiment of the present disclosure.
Figure 6B:
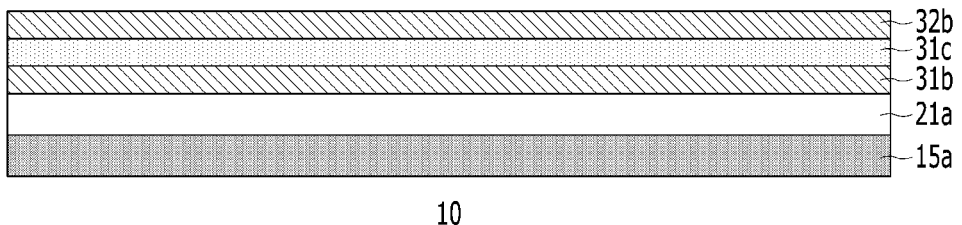
Figure 6C:
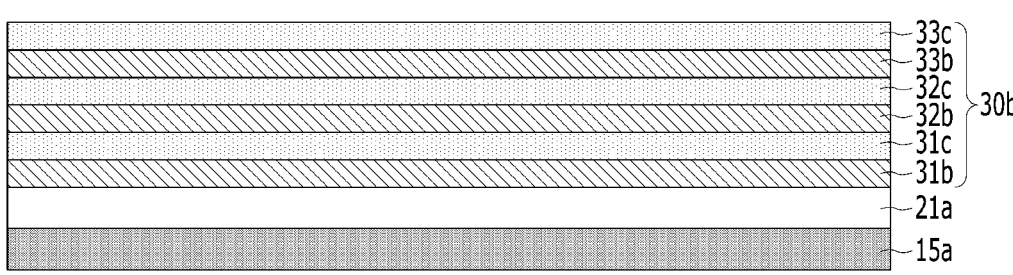

FIGS. 6A to 6C are longitudinal cross-sectional views illustrating a method of forming a transistor of a semicon-ductor device according to an embodiment of the present disclosure. Referring to FIG. 6A, a method of forming a transistor of a semiconductor device according to an embodiment of the present disclosure may include forming a gate dielectric material layer 15*a* on a substrate 10, forming a lower gate barrier material layer 21*a* on the gate dielectric material layer 15*a*, forming a first metal-rich metal oxide layer 31*b* on the lower gate barrier material layer 21*a*, and forming a metal layer 31*c* on the first metal-rich metal oxide layer 31*b*. Forming the first metal-rich metal oxide layer 31*b* may include performing the processes described with reference to FIGS. 4A and 4B. That is, the processes may include forming the first metal-rich metal oxide layer 31*a* and performing the fluorine treatment process for treat-ing the first metal-rich metal oxide layer 31*a* to form the first metal-rich oxide layer 31*b*. The first metal layer 31*c* may include the same metal as the first metal-rich metal oxide layer 31*a*. For example, the first metal layer 31*c* may be a molybdenum (Mo) layer.

Referring to FIG. 6B, the method may further include forming a second metal-rich metal oxide layer 32*b* on the first metal layer 31*c*. Forming the second metal-rich metal oxide layer 32*b* may include performing the processes described with reference to FIGS. 4C and 4D to form the second metal oxide layer 32*a* on the first metal layer 31*c*, and performing the fluorine treatment process for treating the second metal oxide layer 32*a* to form the second metal-rich metal oxide layer 32*b*.

Referring to FIG. 6C, the method may further include forming a metal/metal oxide layer stack 30*b*. Forming the metal/metal oxide layer stack 30*b* may include forming a second metal layer 32*c* on the second metal-rich metal oxide layer 32*b*, forming a third metal-rich metal oxide layer 33*b* on the second metal layer 32*c*, and forming a third metal layer 33*c* on the third metal-rich metal oxide layer 33*b*. The metal/metal oxide layer stack 30*b* may include the metal-rich metal oxide layers 31*b*, 32*b*, and 33*b* and the metal layers 31*c*, 32*c*, and 33*c* stacked alternately. In an embodi-ment, the metal/metal oxide layer stack 30*b* may include at least two metal-rich metal oxide layers and at least two metal layers stacked alternately.

Thereafter, the method may further include performing the processes described with reference to FIGS. 4F to 4H and forming a lower gate electrode 30', a spacer 27, and a buffer layer 25 with reference to FIG. 1C. The lower gate electrode 30' may include metal-rich metal oxide layers 31 to 33 and metal layers 31' to 33' alternately stacked.

Figure 7:
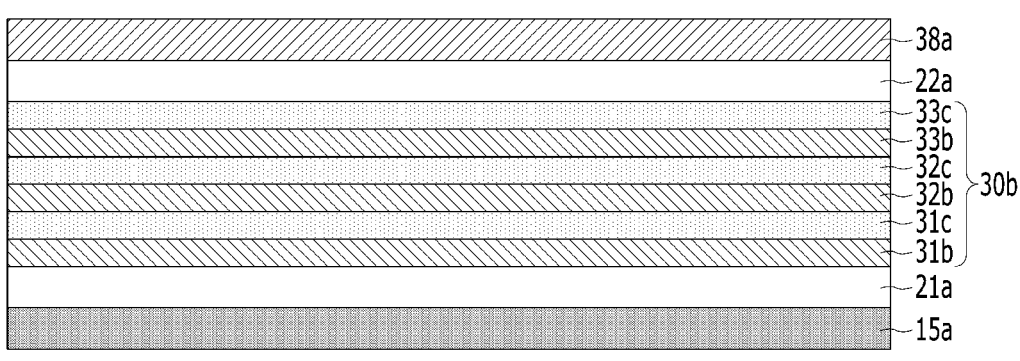
FIG. 7 is a longitudinal cross-sectional view illustrating a method of forming a transistor of a semiconductor device according to an embodiment of the present disclosure.

FIG. 7 is a longitudinal cross-sectional view illustrating a method of forming a transistor of a semiconductor device according to an embodiment of the present disclosure. Referring to FIG. 7, a method of forming a transistor of a semiconductor device according to an embodiment of the present disclosure may include performing the processes described with reference to FIGS. 6A to 6C, and forming an upper gate barrier material layer 22*a* and an upper gate electrode metal layer 38*a* on the uppermost metal layer 33*c* to form a metal/metal oxide layer stack 30*b*. Thereafter, the method may further include performing the processes described with reference to FIGS. 5A to 5B and forming a lower gate electrode 30', an upper gate electrode 38, a spacer 27, and a buffer layer 25 with reference to FIG. 1D.

Figure 8A:
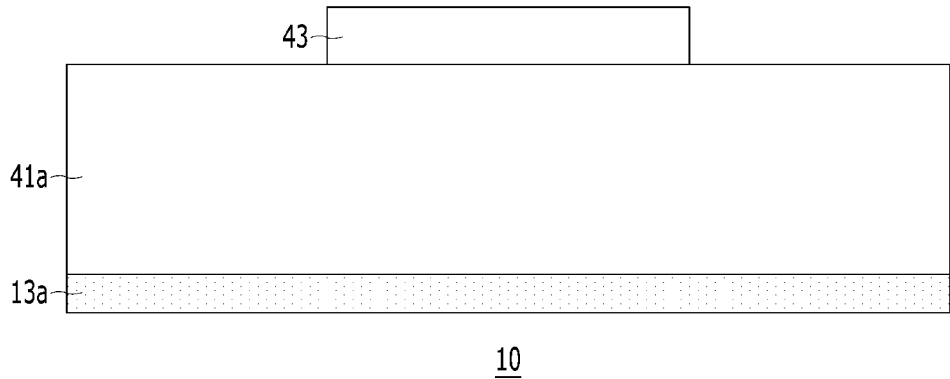
FIGS. 8A to 8I are longitudinal cross-sectional views illustrating a method of forming a transistor of a semiconductor device according to an embodiment of the present disclosure.

FIGS. 8A to 8I are longitudinal cross-sectional views illustrating a method of forming a transistor of a semicon-ductor device according to an embodiment of the present disclosure. Referring to FIG. 8A, a method of forming a transistor of a semiconductor device according to an embodiment of the present disclosure may include forming a sacrificial insulating material layer 13*a* on a substrate 10, a dummy gate electrode material layer 41*a* on the sacrificial insulating material layer 13*a*, and forming a hard mask 43 on the dummy gate electrode material layer 41*a*.

Figure 8B:
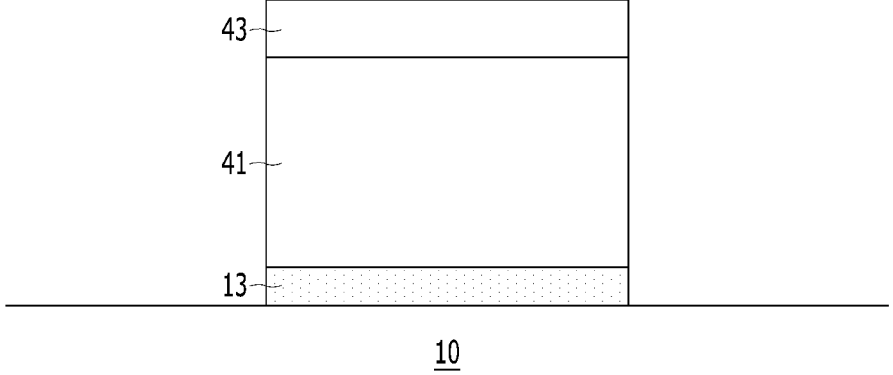

Referring to FIG. 8B, the method may further include performing an etch process to form a dummy gate electrode 41 and a sacrificial insulating layer 13.

Figure 8C:
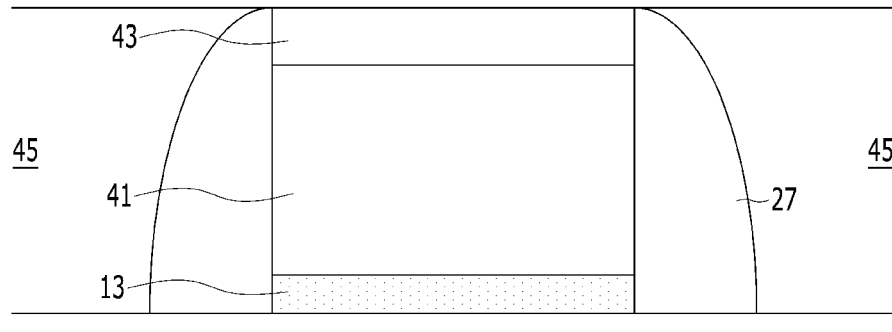

Referring to FIG. 8C, the method may further include forming spacers 27 on both sides of the dummy gate electrode 41 and forming a lower interlayer insulating layer 45 surrounding the spacers 27.

Figures 8D, 8E, 8F:
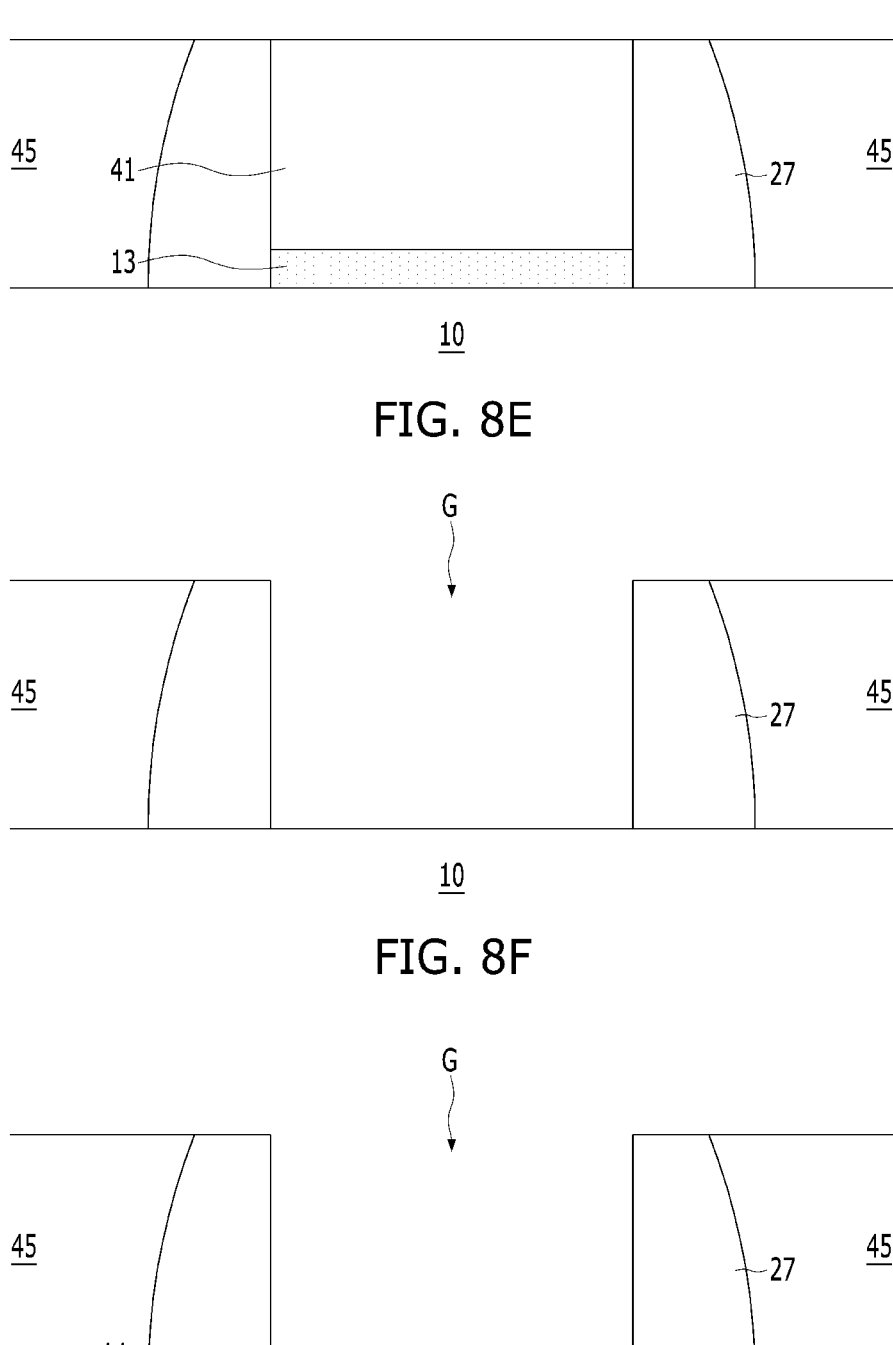

Referring to FIG. 8D, the method may further include removing the hard mask 43 to expose the dummy gate electrode 41 by performing a CMP (Chemical Mechanical Polishing) process. Upper portions of the spacer 27 and the lower interlayer insulating layer 45 may also be partially removed.

Referring to FIG. 8E, the method may further include forming a groove G exposing an upper surface of the substrate 10 by removing the dummy gate electrode 41 and the sacrificial insulating layer 13. The groove G may be defined between the spacers 27.

Referring to FIG. 8F, the method may further include forming an interface insulating layer 14 on the upper surface of the substrate 10 exposed in the groove G.

Figure 8G:
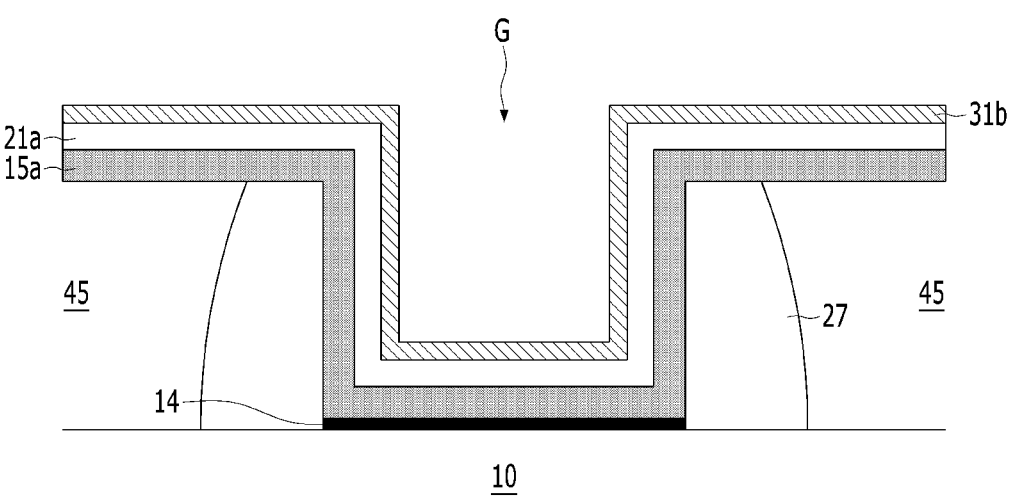

Referring to FIG. 8G, the method may further include forming a gate dielectric material layer 15*a*, a lower gate barrier material layer 21*a*, and a first metal-rich metal oxide layer 31*b* in the groove G. Forming the first metal-rich metal oxide layer 31*b* may include performing the processes described with reference to FIGS. 4A and 4B.

Figure 8H:
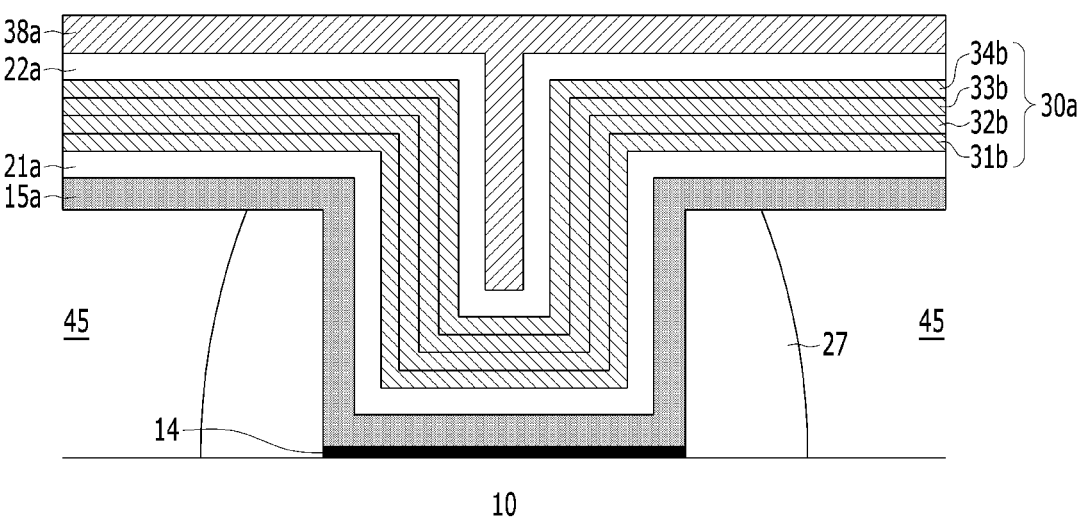

Referring to FIG. 8H, the method may further include stacking metal-rich metal oxide layers 32*b* to 35*b* in the groove G to form a metal-rich metal oxide layer stack 30*a*, and forming an upper gate barrier material layer 22*a* and a gate electrode metal layer 38*a* on the metal-rich metal oxide layer stack 30*a*.

Figure 8I:
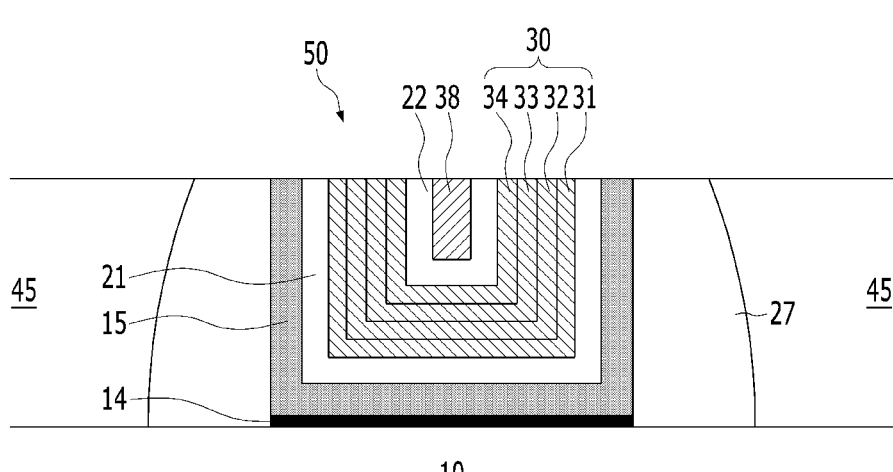

Referring to FIG. 8I, the method further include removing a portion of the gate electrode metal layer 38*a* on the lower interlayer insulating layer 45, a portion of the upper gate barrier material layer 22*a*, and a portion of the metal-rich metal oxide layer stack 30*a*, a portion of the lower gate barrier material layer 21*a*, and a portion of the gate dielectric material layer 15*a* to form a gate insulation layer 15, a lower gate barrier layer 21, a lower gate electrode 30, an upper gate barrier layer 22, and an upper gate electrode 38 to form a gate electrode structure 50 by performing a CMP process. Thereafter, with reference to FIG. 2A, the method may further include forming an upper interlayer insulating layer 46 on the gate electrode structure 50.

Figure 9A:
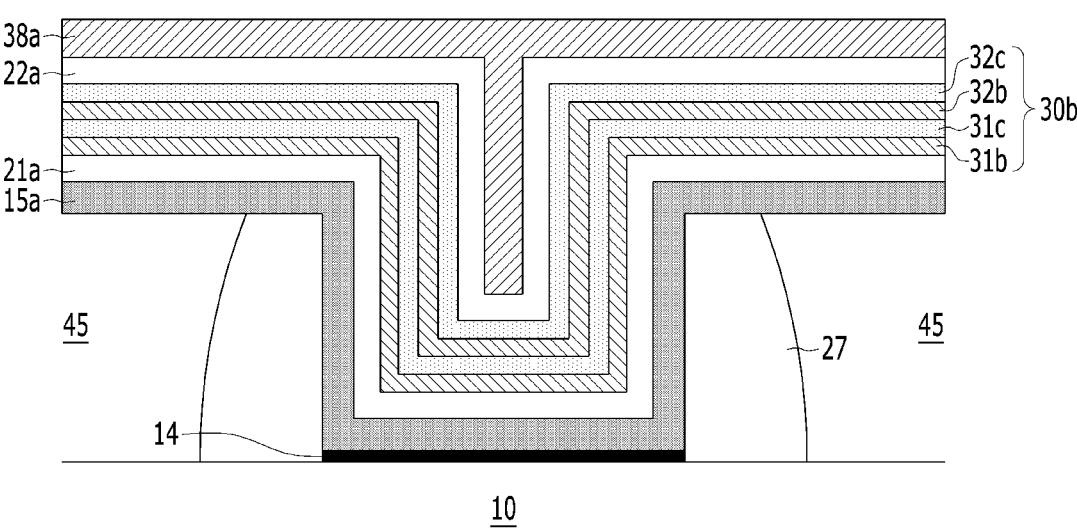
FIGS. 9A and 9B are longitudinal cross-sectional views illustrating a method of forming a transistor of a semiconductor device according to an embodiment of the present disclosure.
Figure 9B:
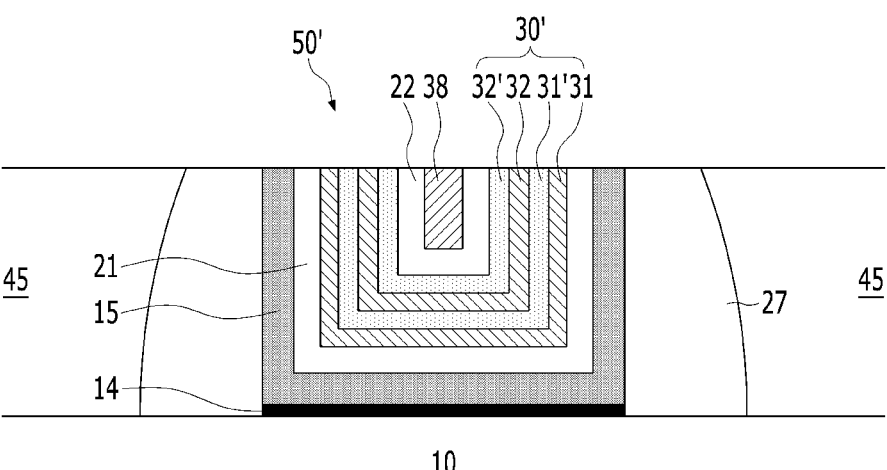

FIGS. 9A and 9B are longitudinal cross-sectional views illustrating a method of forming a transistor of a semiconductor device according to an embodiment of the present disclosure. Referring to FIG. 9A, a method of forming a transistor of a semiconductor device according to an embodiment of the present disclosure may include performing the processes described with reference to FIGS. 6A to 6C and FIGS. 8A to 8H to form a metal/metal oxide layer stack 30*b*, and forming an upper gate barrier material layer 22*a* and an upper gate electrode metal layer 38*a* on the metal/metal oxide layer stack 30*b*.

Referring to FIG. 9B, the method may further include forming a gate electrode structure 50' including a gate dielectric layer 15, a lower gate barrier layer 21, a lower gate electrode 30', an upper gate barrier layer 22, and an upper gate electrode 38 performing a CMP process to remove a portion of the gate electrode metal layer 38*a*, a portion of the upper gate barrier layer 22*a*, a portion of the metal/metal oxide layer stack 30*b*, a portion of the lower gate barrier material layer 21*a*, and a portion of the gate dielectric material layer 15*a* on the lower interlayer insulating layer 45. Thereafter, with reference to FIG. 2B, the method may further include forming an upper interlayer insulating layer 46 on the gate electrode structure 50'.

Figure 10A:
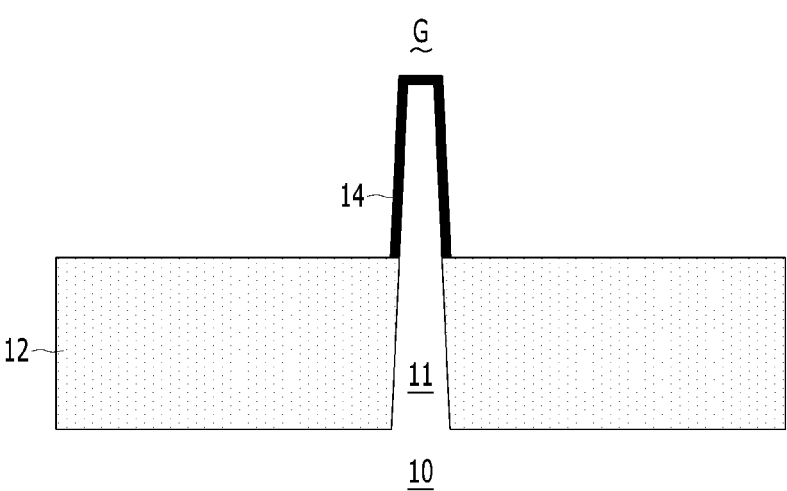
FIGS. 10A and 10B are longitudinal cross-sectional views illustrating a method of forming a transistor of a semiconductor device according to an embodiment of the present disclosure.
Figure 10B:
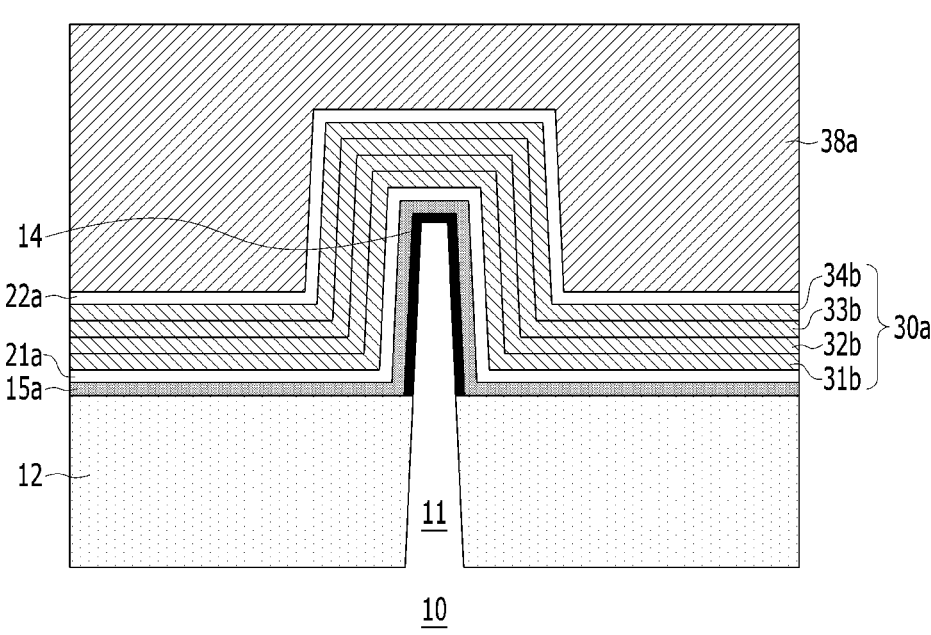

FIGS. 10A and 10B are longitudinal cross-sectional views illustrating a method of forming a transistor of a semiconductor device according to an embodiment of the present disclosure. FIGS. 8A to 8I are longitudinal cross-sectional views taken along the line I-I' of FIG. 3A, and FIGS. 10A and 10B are longitudinal cross-sectional views taken along the line II-II' of FIG. 3A. The substrate 10 of FIGS. 8A to 8I may be regarded as the fin region 11 of FIGS. 10A and 10B.

Referring to FIGS. 8A to 8F and 10A, a method of forming a transistor of a semiconductor device according to an embodiment of the present disclosure may include forming a fin region 11 on a substrate 10, forming a field insulating layer 12 surrounding a lower portion of the fin region 11, and conformally forming an interface insulating layer 14 on a surface of the fin region 11 exposed in a groove G.

Referring to FIGS. 8G, 8H, and 10B, the method may further include forming a gate dielectric material layer 15*a*, a lower gate barrier material layer 21*a*, a metal oxide layer stack 30*a*, an upper gate barrier material layer 22*a*, and a gate electrode metal layer 38*a*. Thereafter, the method may further include performing the CMP process with reference to FIG. 3B, and forming an upper interlayer insulating layer 46.

Figure 11:
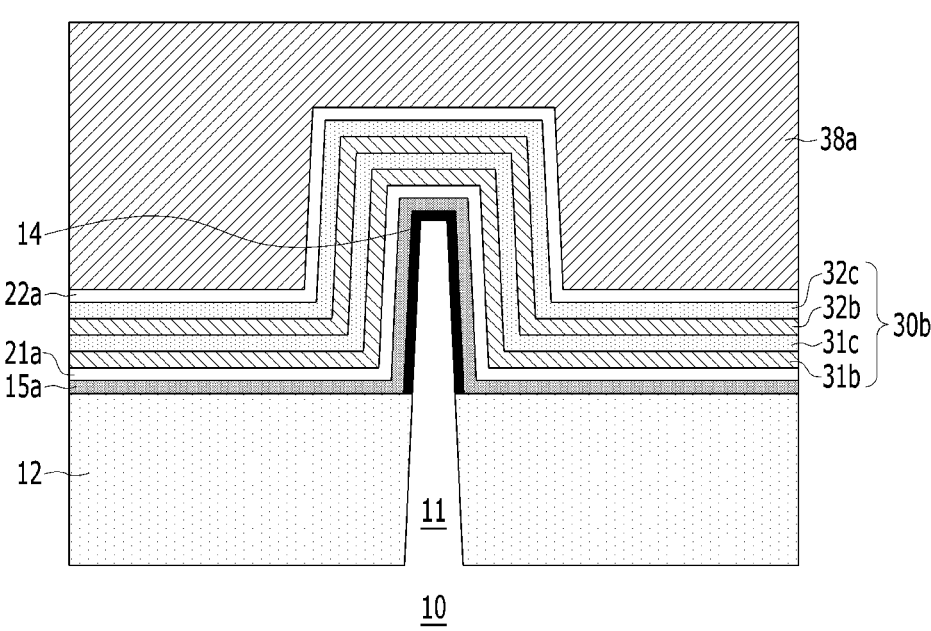
FIG. 11 is a longitudinal cross-sectional view illustrating a method of forming a transistor of a semiconductor device according to an embodiment of the present disclosure.

FIG. 11 is a longitudinal cross-sectional view illustrating a method of forming a transistor of a semiconductor device according to an embodiment of the present disclosure. Referring to FIGS. 11, with further reference to FIGS. 8A to 8H, a method may include forming a gate dielectric material layer 15*a*, a lower gate barrier material layer 21*a*, a metal/metal oxide layer stack 30*b*, and an upper gate barrier material layer 22*a*, and a gate electrode metal layer 38*a*. Thereafter, with reference to FIG. 3B, the method may further include performing the CMP process to form an upper interlayer insulating layer 46.

A semiconductor device according to an embodiment of the present disclosure includes a transistor having a metal-rich metal oxide layer. Accordingly, the semiconductor device can operate at a low voltage and consume less power.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
a gate dielectric layer over a substrate;
a lower gate barrier layer over the gate dielectric layer; and
a lower gate electrode over the lower gate barrier layer,
wherein the lower gate electrode includes a multi-layered structure in which a plurality of metal-rich metal oxide layers has oxygen vacancy concentrations different from each other,
wherein the at least one of the plurality of metal-rich metal oxide layers has a higher metal mass ratio and a higher oxygen vacancy concentration than a metal oxide according to the Law of Definite Proportions to enhance a work function of the lower gate electrode, and
wherein the metal mass ratio is defined as a mass ratio of metal ions that are not bonded to oxygen due to an oxygen vacancy.

2. The semiconductor device of claim 1, wherein the multi-layered structure further includes a plurality of metal layers alternately interposed with the plurality of metal-rich metal oxide layers.

3. The semiconductor device of claim 2, wherein the at least one of the plurality of metal-rich metal oxide layers and the metal layers include a same metal.

4. The semiconductor device of claim 3, wherein the metal layers include molybdenum.

5. The semiconductor device of claim 1, wherein the at least one of the plurality of metal-rich metal oxide layers includes molybdenum oxide.

6. The semiconductor device of claim 1, further comprising:
an upper gate barrier layer formed over the lower gate electrode.

7. The semiconductor device of claim 6, further comprising:
an upper gate electrode formed over the upper gate barrier layer.

8. The semiconductor device of claim 7, wherein the upper gate electrode includes tungsten.

9. The semiconductor device of claim 1, further comprising:
an interface insulating layer formed between the substrate and the gate dielectric layer.

10. The semiconductor device of claim 1, wherein the lower gate barrier layer includes at least one of Ti, TiN, Ti/TIN, Ta, TaN, Ta/TaN, WN, and conductive barrier materials.

11. The semiconductor device of claim 1, wherein the at least one of the plurality of metal-rich metal oxide layers has a metal concentration gradient and an oxygen concentration gradient.

12. A semiconductor device comprising:
an interface insulating layer formed over a substrate;
a gate dielectric layer formed over the interface insulating layer;
a lower gate barrier layer formed over the gate dielectric layer;

13 a lower gate electrode formed over the lower gate barrier layer;

an upper gate barrier layer formed over the lower gate electrode; and an upper gate electrode formed over the upper gate barrier layer, wherein the lower gate electrode includes a plurality of metal-rich metal oxide layers having oxygen vacancy concentrations different from each other, wherein the plurality of metal-rich metal oxide layers has a higher metal mass ratio and a higher oxygen vacancy concentration than a metal oxide according to the Law of Definite Proportions to enhance a work function of the lower gate electrode, and wherein the metal mass ratio is defined as a mass ratio of metal ions that are not bonded to oxygen due to an oxygen vacancy.

13. The semiconductor device of claim 12, wherein:

the upper gate barrier layer surrounds side surfaces and a bottom surface of the upper gate electrode, the lower gate electrode surrounds side surfaces and a bottom surface of the upper gate barrier layer, the lower gate barrier layer surrounds side surfaces and a bottom surface of the lower gate electrode, and the gate dielectric layer surrounds side surfaces and a bottom surface of the lower gate barrier layer.

14. The semiconductor device of claim 12, wherein the plurality of metal-rich metal oxide layers includes molybdenum oxide.

15. The semiconductor device of claim 12, wherein the lower gate electrode includes the plurality of metal-rich metal oxide layers and a plurality of metal layers alternately stacked.

16. The semiconductor device of claim 15, wherein the plurality of metal layers includes molybdenum.

17. The semiconductor device of claim 12, wherein the plurality of metal-rich metal oxide layers has a metal concentration gradient and an oxygen concentration gradient.

18. A semiconductor device comprising:

a fin region protruding from a substrate;

a field insulating layer formed over the substrate and surrounding a lower portion of the fin region;

an interface insulating layer formed over a surface of the fin region;

a gate dielectric layer formed over an upper surface of the field insulating layer and an upper surface of the interface insulating layer;

a lower gate barrier layer formed over the gate dielectric layer; and a lower gate electrode formed over the lower gate barrier layer, wherein the lower gate electrode includes a multi-layered structure in which a plurality of metal-rich metal oxide layers have oxygen vacancy concentrations different from each other, wherein the plurality of metal-rich metal oxide layers has a higher metal mass ratio and a higher oxygen vacancy concentration than a metal oxide according to the Law of Definite Proportions to enhance a work function of the lower gate electrode, and wherein the metal mass ratio is defined as a mass ratio of metal ions that are not bonded to oxygen due to an oxygen vacancy.

19. The semiconductor device of claim 18, wherein the plurality of metal-rich metal oxide layers includes a plurality of molybdenum oxide layers.

20. The semiconductor device of claim 18, wherein the multi-layered structure further includes a plurality of metal layers alternately interposed with the plurality of metal-rich metal oxide layers.

* * * * *